(12) United States Patent
Watanabe

(10) Patent No.: US 9,247,651 B2
(45) Date of Patent: Jan. 26, 2016

(54) FLEXIBLE PRINTED CIRCUIT AND METHOD OF MANUFACTURING SAME

(75) Inventor: Hirohito Watanabe, Sakura (JP)

(73) Assignee: FUJIKURA LTD., Tokyo (JP)

( * ) Notice: Subject to any disclaimer, the term of this patent is extended or adjusted under 35 U.S.C. 154(b) by 605 days.

(21) Appl. No.: 12/754,929

(22) Filed: Apr. 6, 2010

(65) Prior Publication Data

US 2010/0307797 A1  Dec. 9, 2010

(30) Foreign Application Priority Data

Jun. 9, 2009   (JP) .................. 2009-137967

(51) Int. Cl.
| | |
|---|---|
| H05K 1/00 | (2006.01) |
| H05K 1/03 | (2006.01) |
| H05K 1/16 | (2006.01) |
| H05K 1/11 | (2006.01) |
| H05K 3/28 | (2006.01) |
| H05K 1/02 | (2006.01) |
| H05K 3/00 | (2006.01) |
| H05K 3/38 | (2006.01) |

(52) U.S. Cl.
CPC ............. *H05K 3/281* (2013.01); *H05K 1/0281* (2013.01); *H05K 3/0058* (2013.01); *H05K 3/386* (2013.01); *H05K 2201/2009* (2013.01); *H05K 2203/0195* (2013.01); *H05K 2203/0278* (2013.01); *Y10T 29/49124* (2015.01)

(58) Field of Classification Search
CPC ................ H05K 1/0393; H05K 1/189; H01L 2924/01079
USPC .......... 174/254, 255, 260, 261, 262; 428/209, 428/210; 361/749, 750
See application file for complete search history.

(56) References Cited

U.S. PATENT DOCUMENTS

| | | | | |
|---|---|---|---|---|
| 5,461,202 A | * | 10/1995 | Sera et al. ...................... | 174/254 |
| 5,989,669 A | * | 11/1999 | Usami .......................... | 428/64.1 |
| 6,204,454 B1 | * | 3/2001 | Gotoh et al. .................. | 174/255 |
| 6,744,122 B1 | * | 6/2004 | Hashimoto .................... | 257/668 |
| 7,250,330 B2 | * | 7/2007 | Thomas et al. ............... | 438/127 |

FOREIGN PATENT DOCUMENTS

| | | | |
|---|---|---|---|
| CN | 1178981 A | | 4/1998 |
| JP | 03-159189 A | | 7/1991 |
| JP | 11-288750 A | | 10/1999 |
| JP | 11288750 A | * | 10/1999 |
| JP | 2003-297516 A | | 10/2003 |
| JP | 2005-217286 A | | 8/2005 |
| JP | 2005-268416 A | | 9/2005 |
| JP | 2007-98816 A | | 4/2007 |

* cited by examiner

*Primary Examiner* — Eric Thomas
*Assistant Examiner* — Arun Ramaswamy
(74) *Attorney, Agent, or Firm* — Westerman, Hattori, Daniels & Adrian, LLP

(57) ABSTRACT

To improve reliability by preventing separation of a sheet material attached on a flexible printed circuit, provided is a flexible printed circuit including a printed board body and a reinforcing board. A leaked portion of an adhesive agent is formed to leak in an outward direction relative to an end surface of the reinforcing board. The leaked portion adheres to part of the end surface of the reinforcing board to be continuous from a lower end of the end surface to form an inclined surface tapered in the outward direction. The leaked portion is formed such that a portion thereof that covers the end surface has an adhesion height hA, as measured from an adhesive surface of the reinforcing board, of greater than 0% and not greater than 80% of the thickness H1 of the reinforcing board.

2 Claims, 4 Drawing Sheets

FLEXIBLE PRINTED CIRCUIT AND METHOD OF MANUFACTURING SAME

CROSS-REFERENCE TO RELATED APPLICATIONS

The present disclosure relates to subject matters contained in Japanese Patent Application No. 2009-137967 filed on Jun. 9, 2009, which are expressly incorporated herein by reference in its entireties.

BACKGROUND OF THE INVENTION

1. Field of the Invention

The present invention relates to a flexible printed circuit composed of a flexible insulating film and a circuit formed thereon and a method of manufacturing the same, and particularly to a flexible printed circuit with an improved reliability obtained from prevention of separation of a sheet material attached on the flexible printed circuit and a method of manufacturing the same.

2. Description of the Related Art

Conventionally, printed circuit boards and methods of manufacturing the same have been known for improving the reliability of flexible printed circuits (FPC) (e.g., see JP2005-268416A (pp. 3-6, FIGS. 1-3)). A printed circuit board is composed of a circuit board on which a circuit pattern is formed, and a coverlay film having an opening and attached on a surface of the circuit board.

A projection is formed on the surface of a portion of the circuit pattern to which the opening is aligned, and an adhesive agent of the coverlay film is prevented by the projection from flowing into the opening. Also known are a releasing film and a method for manufacturing a circuit board (e.g., see JP2007-98816A (pp. 4-12, FIGS. 1-3)).

The releasing film is used when a circuit board is manufactured using a core base board having a convex circuit of an average height of A μm, and comprises a first layer to a third layer layered in this order. This film is designed such that when the first layer and the circuit are contact-pressed at a pressure of 4 MPa and a temperature lower than a melting point of a polyester resin by 50° C., A/B×100 is equal to 70% or greater, where B is an average height in μm at which the first layer is intruded into the gap of the adjacent convex circuit. According to this document, this can prevent leakage of the adhesive agent, etc.

Meanwhile, flexible printed circuits still suffer from a problem that a sheet material 200 attached on a board body 100 comes off therefrom, as shown in FIG. 9. The cause of this problem is considered to be as follows. That is, an adhesive agent 300 located between a board surface 100a of the board body 100 and an adhesive surface 200a of the sheet material 200 leaks from the side of an end surface 200b of the sheet material 200 onto the board surface 100a in a tapered shape.

Then, when a stress or the like is applied to an edge 200c of the end surface 200b of the sheet material 200 that is closer to the board body 100, a crack 301 forms in the leaked adhesive agent 300. The adhesive agent 300 breaks from this crack 301 and the sheet material 200 gets peeled from the board body 100.

Accordingly, there is a demand for a measure against leakage of an adhesive agent caused in the printed circuit board disclosed in JP2005-268416A and in the releasing film disclosed in JP2007-98816A, and for a measure for more effectively preventing separation of a sheet material from a flexible printed circuit to improve reliability.

To solve the problem of the conventional techniques described above, an object of the present invention is to provide a flexible printed circuit and a method of manufacturing the same which can improve reliability by preventing separation of a sheet material attached on a flexible printed circuit.

SUMMARY OF THE INVENTION

To solve the problem described above and achieve the object, a flexible printed circuit according to the present invention includes: a board composed of a base film having an insulating property and a circuit made of a conductor pattern formed on the base film; and a sheet material stacked on the board through an adhesive agent. The adhesive agent has a leaked portion leaked in an outward direction relative to an end surface of the sheet material, and the leaked portion adheres to part of the end surface of the sheet material to be continuous from a lower end of the end surface to form an inclined surface tapered in the outward direction.

The leaked portion is formed such that a portion thereof that adheres to the end surface has an adhesion height, as measured from an adhesive surface of the sheet material, of greater than 0% and not greater than 80% of a thickness of the sheet material.

For example, the board is a printed board body composed of a copper-clad laminate and a coverlay attached on the copper-clad laminate, and the sheet material is a reinforcing board to reinforce the printed board body.

For example, the board is a copper-clad laminate, and the sheet material is a coverlay to protect the copper-clad laminate.

A method of manufacturing a flexible printed circuit according to the present invention includes, when stacking the sheet material on the board in the above-described invention, forming the leaked portion by placing a pressure member to apply a pressure to its nearby region including the end surface of the sheet material.

According to the present invention, it is possible to provide a flexible printed circuit and a method of manufacturing the same which can improve reliability by preventing separation of a sheet material attached on a flexible printed circuit.

DETAILED DESCRIPTION OF THE EMBODIMENTS

A preferred embodiment of a flexible printed circuit and a method of manufacturing the same according to the present invention will be explained below with reference to the accompanying drawings.

Figure 1:
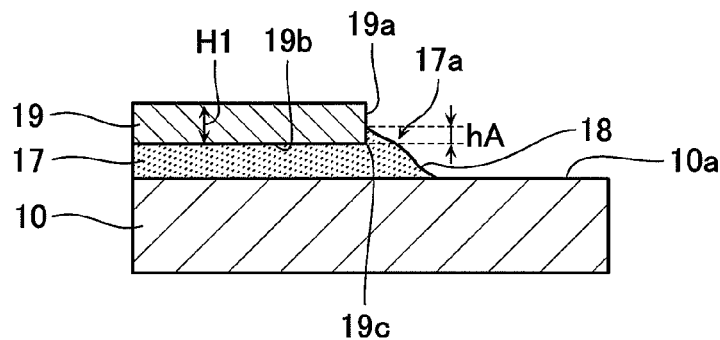
FIG. 1 is an explanatory diagram for explaining a flexible printed circuit according to one embodiment of the present invention.
Figure 2:
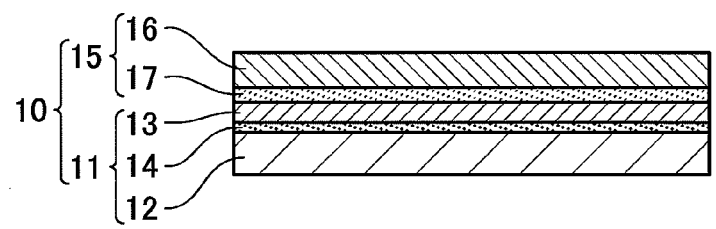
FIG. 2 is an explanatory diagram for explaining an example of structure of a printed board body of the flexible printed circuit.

FIG. 1 is an explanatory diagram for explaining a flexible printed circuit according to one embodiment of the present invention. FIG. 2 is an explanatory diagram for explaining an example of structure of a printed board body of the flexible printed circuit. As shown in FIG. 1, the flexible printed circuit has a structure composed of a flexible printed board body (hereinafter referred to as "printed board body") 10, and a reinforcing board 19, which is a sheet material attached and stacked on one board surface 10a of the printed board body 10 through an adhesive agent 17 in order to reinforce the printed board body 10.

As shown in FIG. 2, the printed board body 10 comprises, for example, a copper-clad laminate 11 and a coverlay 15 disposed on one surface side of the copper-clad laminate 11. The copper-clad laminate 11 comprises a base film 12 having an insulating property made of a resin such as polyethylene terephthalate (PET), polyethylene naphthalate (PEN), polyimide (PI), polyamide (PA), etc., and a circuit 13 patterned out from a metal conductor such as Cu, Au, Ag, etc. attached on one surface of the base film 12 through an adhesive agent 14 made of a heat-resistant thermoplastic polyimide resin, etc.

The coverlay 15 attached on the copper-clad laminate 11 comprises a film material 16 made of a resin having an insulating property such as polyimide, etc. described above, and an adhesive agent 17 made of a heat-resistant thermoplastic polyimide resin, etc. described above likewise. The coverlay 15 is attached through the adhesive agent 17 to cover the circuit 13 of the copper-clad laminate 11.

The copper-clad laminate 11 may comprise circuits 13 on both surfaces of the base film 12 through adhesive agents 14. In this case, it is desirable that the coverlay 15 be provided to cover the circuits 13 on both the surfaces. Furthermore, a plurality of such copper-clad laminates 11, which each have a circuit 13 on one surface or both surfaces, may be stacked together. In this case, it is desirable that the coverlay 15 be provided to cover at least the circuit 13 that is the most external in the stacking direction.

On the other hand, the reinforcing board 19 comprises a resin board made of polyimide, etc. described above, a glass epoxy resin board, a metal board made of stainless material, etc., a sheet-like member made of liquid crystal polymer, etc., or a resin molded sheet made of a material such as polyetherimido, liquid crystal polymer, etc. An end surface 19a of the reinforcing board 19 is formed by a cut process or the like, and has a greater surface roughness than an adhesive surface 19b.

The flexible printed circuit structured as described above has a leaked portion 17a, which is made of the adhesive agent 17 leaked in an outward direction relative to the end surface 19a of the reinforcing board 19. For example, the leaked portion 17a adheres to part of the end surface 19a of the reinforcing board 19 to be continuous from a lower end (an edge 19c) of the end surface 19a to form an inclined surface 18 that is tapered in this outward direction.

The leaked portion 17a is formed such that an adhesion height hA (see FIG. 1), as measured from the adhesive surface 19b of the reinforcing board 19, of a portion of the inclined surface 18 that covers the end surface 19a (i.e., a portion continuously adhering to the end surface 19a) is greater than 0% and not greater than 80% of the thickness H1 of the reinforcing board 19. In other words, the leaked portion 17a of the adhesive agent 17 is not formed to have its inclined surface 18 cover the entire end surface 19a of the reinforcing board 19.

Figure 9:
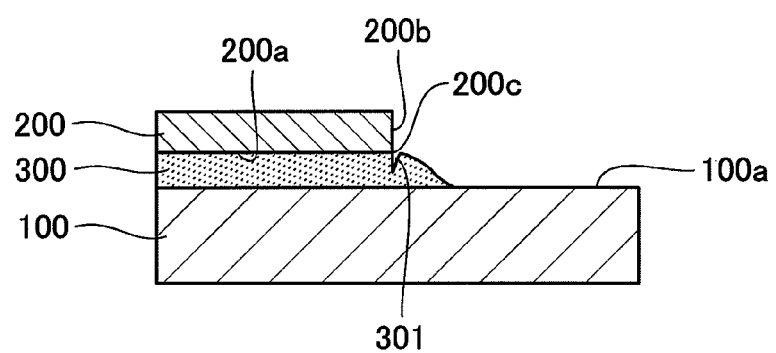
FIG. 9 is an explanatory diagram for explaining a conventional flexible printed circuit.

Accordingly, the areas over which the adhesive agent 17 adheres to the printed board body 10 and to the reinforcing board 19 are made larger than those in, for example, the conventional one shown in FIG. 9, which makes it possible to improve the adhesive strength. Furthermore, since the adhesive agent 17 has leaked and adhered also to part of the rough end surface 19a, the adhesive strength can be enhanced.

The edge 19c of the end surface 19a of the reinforcing board 19, which edge is closer to the printed board body 10 and which is likely to be the start point of separation of the reinforcing board 19 is embraced in the adhesive agent 17 because of the leaked portion 17a. Therefore, the flexible printed circuit according to the present embodiment can improve reliability by preventing separation of the reinforcing board 19 from the printed board body 10.

Figure 3:
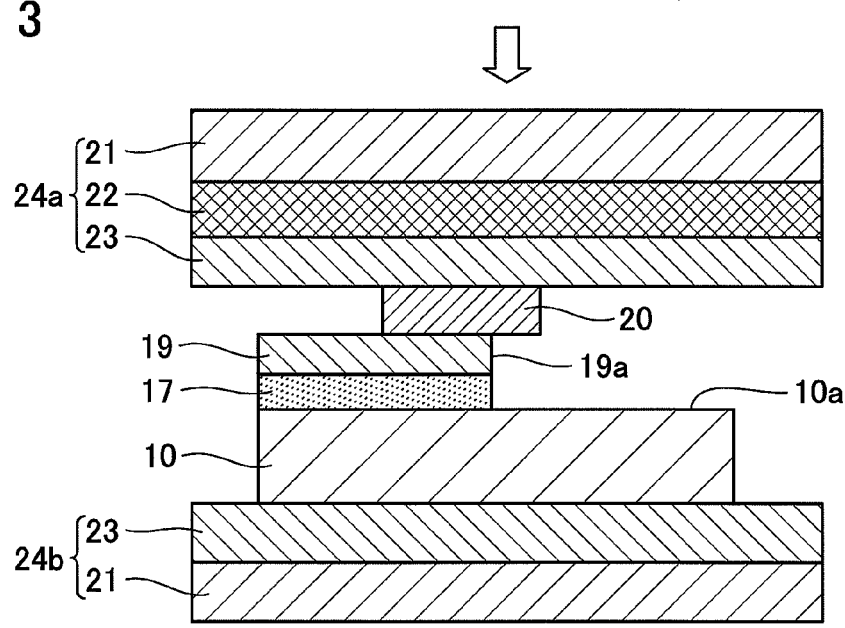
FIG. 3 is an explanatory diagram for explaining an example of manufacturing process according to a method of manufacturing the flexible printed circuit.

FIG. 3 is an explanatory diagram for explaining an example of a manufacturing process according to a method of manufacturing a flexible printed circuit according to one embodiment of the present invention. First, as shown in FIG. 3, the reinforcing board 19 to which the adhesive agent 17 is provided (coated, etc.) is stacked on the board surface 10a of the printed board body 10, and a polyimide film 20 is placed on the reinforcing board 19 as a pressure member that applies a pressure to its nearby region including the end surface 19.

Then, these members are placed between an upper die 24a that is composed of, for example, a stainless plate 21 provided with a separator 23 through a cushion member 22, and a lower die 24b that is likewise composed of a stainless plate 21 provided with a separator 23. While these members are heated, the upper die 24a is moved in the direction indicated by an outline arrow in FIG. 3 to press (cure) these members, to thereby manufacture a flexible printed circuit composed of the printed board body 10 and the reinforcing board 19 stacked thereon.

Due to this, pressure to the nearby region including the end surface 19 is increased, and the leaked portion 17a (see FIG. 1) of the adhesive agent 17 is formed adhering to part of the end surface 19a as described above. In this process, regardless of presence or absence of the polyimide film 20 mentioned above, it is possible to form the leaked portion 17a having the same structure by adjusting the material properties of the adhesive agent 17 or changing the heating/pressurizing conditions to desired ones.

The following description explains investigation tests which the applicant of the present application has carried out to verify the effect of the flexible printed circuit according to the present invention. In the tests, a plurality of samples that had undergone different ways of leak of the adhesive agent 17 from the side of the end surface 19a of the reinforcing board 19 (i.e., different states of formation of the inclined surface 18 of the leaked portion 17a) were stored under an atmosphere of high temperature and high humidity, and susceptibility of the reinforcing board 19 to separation was investigated.

In the investigation tests, the thickness of the base film 12 of the copper-clad laminate 11 of the printed board body 10 was 25 μm, the thickness of the adhesive agent 14 was 10 μm, and the thickness of the circuit 13 was 35 μm. The thickness of the film material 16 of the coverlay 15 of the printed board body 10 was 25 μm, and the thickness of the adhesive agent 17 was 35 μm. The reinforcing board 19 made of a polyimide resin and having thickness H1 of 125 μm was attached to the board surface 10a of the printed board body 10 by the adhesive agent 17 made of a thermosetting resin.

In attaching the reinforcing board 19, the attaching conditions were varied, whereby five samples having undergone different ways of leak of the adhesive agent 17 were manufactured. For example, in the sample No. 1, the adhesive agent 17 did not adhere to the end surface 19a of the reinforcing board 19 (i.e., the adhesion height hA was 0 μm). In the samples Nos. 2 to 4, the adhesion height hA of the adhesive agent 17 was 2 μm, 50 μm, and 100 μm respectively.

Figure 4:
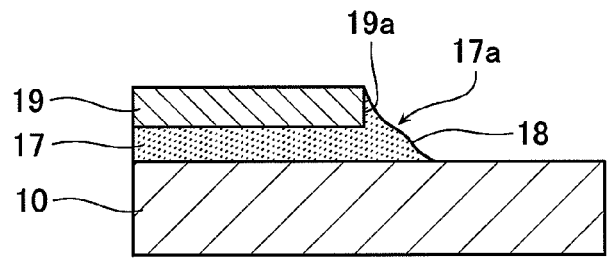
FIG. 4 is an explanatory diagram for explaining one sample flexible printed circuit used in tests carried out by the applicant of the present application.

In the sample No. 5, the inclined surface 18 was formed to have the adhesive agent 17 adhere to the entire end surface 19a of the reinforcing board 19 (i.e., the adhesion height hA was the same 125 μm as the thickness H1 of the reinforcing board 19), as shown in FIG. 4.

Figure 5:
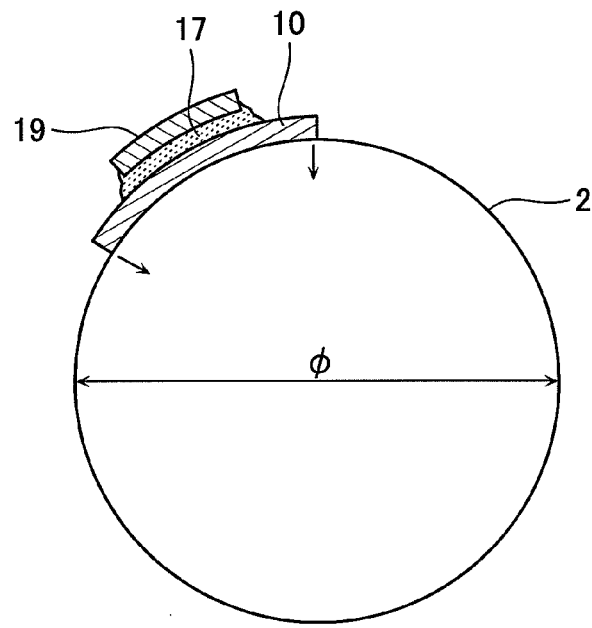
FIG. 5 is an explanatory diagram for explaining an outline of the tests carried out by the applicant.

In a first investigation test (test 1), as shown in FIG. 5, these five samples were wound around a cylindrical member 2 having a diameter φ of 20 mm to be bent toward the side of the printed board body 10 such that a stress was applied to them in the direction indicated by arrows in FIG. 5. After this, they were stored under an atmosphere in which, for example, the temperature was 85° C. and the humidity was 85% for 100 hours. The degree of separation of the reinforcing board 19 at the side of the end surface 19a was observed by a microscope. The results are shown in Table 1.

TABLE 1

| Sample No. | 1 | 2 | 3 | 4 | 5 |
|---|---|---|---|---|---|
| Adhesion Height hA | 0 | 2 | 50 | 100 | 125 |
| Test 1 | x | o | o | o | o |
| Test 2 | o | o | o | o | x |

In Table 1, "x" indicates that a separation of the reinforcing board 19 occurred, and "o" indicates that no separation of the reinforcing board 19 occurred. The test 1 did not simulate an actual state under which the flexible printed circuit may be used. However, by storing the flexible printed circuit under the above-described atmosphere while applying a certain stress thereto, the test was carried out as an accelerated test for checking long-term reliability of the product.

In a second investigation test (test 2), the external surface of the reinforcing board 19 of the samples No. 1 to No. 5 having undergone the test 1 was observed by a microscope to check whether or not there occurred any adhesion of the adhesive agent 17 to the external surface due to the possibility of the adhesive agent 17 having leaked onto the external surface (i.e., due to the possibility of the inclined surface 18 of the leaked portion 17a existing also on the external surface of the reinforcing board 19). In Table 1 above, "x" indicates that there occurred adhesion of the adhesive agent 17 to the external surface, and "o" indicates that there occurred no adhesion of the adhesive agent 17 to the external surface.

By the test 1 and the test 2, it was confirmed that when the adhesion height hA by which the adhesive agent 17 adhered to the end surface 19a of the reinforcing board 19 was 2 μm or greater, there occurred no crack or the like and the above-described effect of improving the adhesive strength was achieved. However, it was confirmed that when the adhesive agent 17 adhered to the entire end surface 19a of the reinforcing board 19 as in the sample No. 5 shown in FIG. 4, the adhesive agent 17 adhered also to the external surface of the reinforcing board 19, which may improve the adhesive strength but is not desirable in terms of product appearance.

Accordingly, it turned out that particularly when the adhesion height hA by which the adhesive agent 17 (the leaked portion 17a) adhered to the end surface 19a of the reinforcing board 19 was greater than 0% and not greater than 80% of the thickness H1 of the reinforcing board 19, it was possible to obtain a structure that would improve the adhesive strength between the printed board body 10 and the reinforcing board 19 and would not sacrifice the product appearance.

As is clear from the above, according to the flexible printed circuit according to the present embodiment, it is possible to improve the reliability of the flexible printed circuit by effectively preventing separation of the reinforcing board 19 attached to the printed board body 10.

Figure 6:
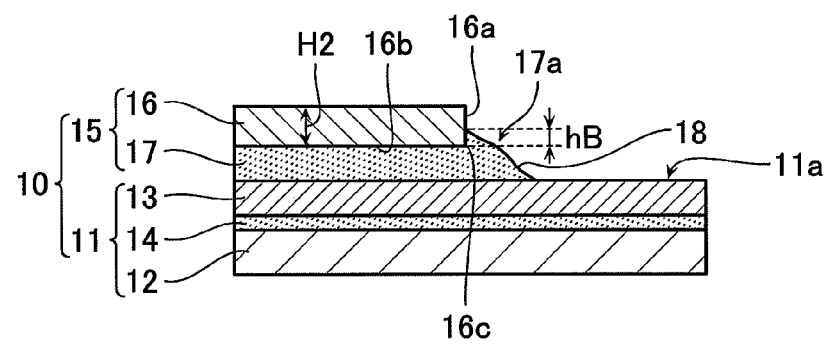
FIG. 6 is an explanatory diagram for explaining another example of the flexible printed circuit.

FIG. 6 is an explanatory diagram for explaining another example of a flexible printed circuit. FIG. 7 are explanatory diagrams for explaining structure of the flexible printed circuit according to another example. FIG. 8 is an explanatory diagram for explaining another example of a manufacturing process according to a method of manufacturing a flexible printed circuit. In the following description, it is assumed that any portions that are the same as those already explained will be denoted by the same reference numerals and not be explained redundantly, and that any matters that are irrelevant to the present invention might not be described specifically.

As shown in FIG. 6, the flexible printed circuit according to the present example is characteristic in that a leaked portion 17a is formed in relation to the adhesive agent 17 of the coverlay 15 not of the reinforcing board 19, when the coverlay 15 is stacked (attached) onto the copper-clad laminate 11 of the printed board body 10.

Figure 7A:
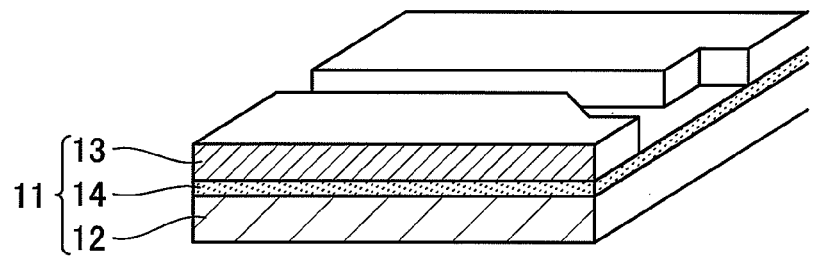
FIGS. 7A and 7B are explanatory diagrams for explaining the structure of the flexible printed circuit according to another example.
Figure 7B:
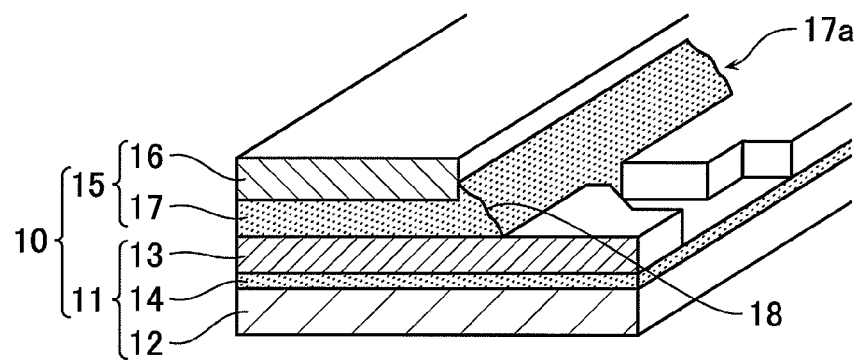
Figure 8:
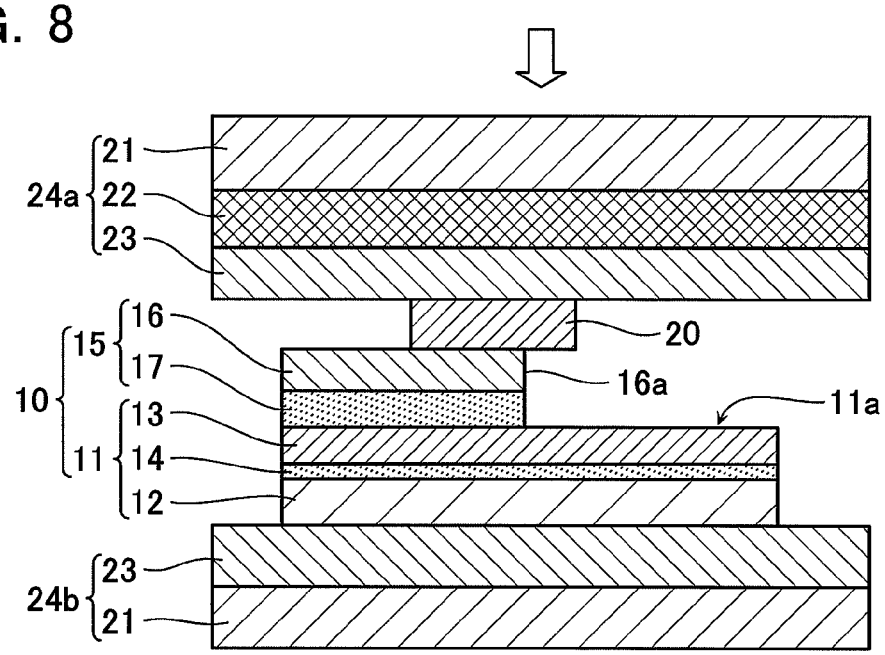
FIG. 8 is an explanatory diagram for explaining another example of manufacturing process according to a method of manufacturing the flexible printed circuit.

The printed board body 10 comprises: a copper-clad laminate 11 composed of a base film 12 and a conductor such as a copper foil that is attached on the base film 12 through an adhesive agent 14 and from which a circuit 13 is patterned out by etching, etc. as shown in FIG. 7A; and a coverlay 15 that is attached on the copper-clad laminate 11 and composed of a film material 16 to which an adhesive agent 17 is provided as shown in FIG. 7B.

In the printed board body 10, a leaked portion 17a of the adhesive agent 17 is formed at the side of an end surface 16a of the film material 16 of the coverlay 15. As shown in FIG. 6, the leaked portion 17a adheres to part of the end surface 16a of the film material 16 to be continuous from a lower end of the end surface 16a to form an inclined surface 18 that is tapered in an outward direction.

The leaked portion 17a is formed such that an adhesion height hB, as measured from an adhesive surface 16b of the film material 16, of a portion of the interface 18 that covers the end surface 16a is greater than 0% and not greater than 80% of a thickness H2 of the film material 16 like as described above. The end surface 16a of the film material 16 is formed to have a greater surface roughness than the adhesive surface 16b. Accordingly, the areas over which the adhesive agent 17 adheres to the copper-clad laminate 11 and to the film material 16 can be increased, which makes it possible to improve the adhesive strength of the coverlay 15. Other functions and effects are similar to those described above and will not be explained here.

This printed board body 10 is manufactured as shown in FIG. 8. That is, the coverlay 15 to which the adhesive agent 17 is provided is stacked on a surface 11a of the copper-clad laminate 11, and a polyimide film 20 that applies a pressure to its nearby region including the end surface 16a of the film material 16 is placed on the coverlay 15.

Then, these members are placed between an upper die 24a including a stainless plate 21, a cushion member 22, and a separator 23 and a lower die 24b including a stainless plate 21 and a separator 23, and heated and pressured by moving the upper die 24a in the direction indicated by an outline arrow in FIG. 8. In this way, the printed board body 10 composed of the copper-clad laminate 11 and the coverlay 15 stacked thereon is manufactured.

Due to this, pressure to the nearby region including the end surface 16a is increased, and the leaked portion 17a (see FIG. 6) of the adhesive agent 17 is formed adhering to part of the end surface 16a as described above. The applicant has carried out similar investigation tests to the test 1 and test 2 described above on the printed board body 10 structured in this way.

Here, five samples having undergone different ways of leak of the adhesive agent 17 from the side of the end surface 16a of the film material 16 of the coverlay 15 were stored under the above-described atmosphere for 100 hours, and susceptibility of the coverlay 15 to separation was investigated. In the present tests, the thickness of the base film 12, adhesive agent 14, and circuit 13 of the copper-clad laminate 11 was 25 μm, 10 μm, and 35 μm respectively, the thickness H2 of the film material 16 of the coverlay 15 was 25 μm, and the thickness of the adhesive agent 17 was 35 μm.

In the sample No. 1, the adhesive agent 17 did not adhere to the end surface 16a of the film material 16 (i.e., the adhesion height hB was 0 μm). In the samples Nos. 2 to 4, the adhesion height hB of the adhesive agent 17 was 2 μm, 10 μm, and 20 μm respectively. In the sample No. 5, the interface 18 was formed to have the adhesive agent 17 adhere to the entire end surface 16a of the film material 16 (i.e., the adhesion height hB was the same 25 μm as the thickness H2 of the film material 16), though not illustrated.

In a first investigation test (test 1), as has been shown in FIG. 5, these five samples were wound around a cylindrical member 2 to be bent toward the side of the copper-clad laminate 11 and brought under a stress in the same way. After they were stored under the above-described atmosphere for the prescribed period, the degree of separation of the film material 16 at the side of the end surface 16a was observed by a microscope. The results are shown in Table 2.

TABLE 2

| Sample No. | 1 | 2 | 3 | 4 | 5 |
|---|---|---|---|---|---|
| Adhesion Height hB | 0 | 2 | 10 | 20 | 25 |
| Test 1 | x | o | o | o | o |
| Test 2 | o | o | o | o | x |

In Table 2, "x" indicates that a separation of the film material 16 occurred, and "o" indicates that no separation of the film material 16 occurred. In a second investigation test (test 2), the external surface of the coverlay 15 of the samples No. 1 to No. 5 was observed by a microscope in the same way as described above to check whether or not there occurred any adhesion of the adhesive agent 17 to the external surface due to the possibility of the adhesive agent 17 having leaked onto the external surface of the film material 16. In Table 2 above, "x" indicates that there occurred adhesion of the adhesive agent 17 to the external surface, and "o" indicates that there occurred no adhesion of the adhesive agent 17 to the external surface.

By the test 1 and the test 2, it was confirmed that when the adhesion height hB by which the adhesive agent 17 adhered to the end surface 16a of the film material 16 was 2 μm or greater, there occurred no crack or the like and the above-described effect of improving the adhesive strength was achieved. In the sample No. 5, it was confirmed that the adhesive agent 17 also adhered to the external surface of the film material 16.

Accordingly, it turned out that particularly when the adhesion height hB by which the adhesive agent 17 (the leaked portion 17a) adhered to the end surface 16a of the film material 16 was greater than 0% and not greater than 80% of the thickness H2 of the film material 16, it was possible to obtain a structure that would improve the adhesive strength between the copper-clad laminate 11 and the coverlay 15 and would not sacrifice the product appearance, like as described above.

As is clear, according to this flexible printed circuit too, it is possible to improve the reliability of the flexible printed circuit by effectively preventing separation of the coverlay 15 attached to the copper-clad laminate 11 that constitutes the printed board body 10.

What is claimed is:

1. A flexible printed circuit, comprising: a board composed of a base film having an insulating property and a circuit made of a conductor pattern formed on the base film; and a sheet material stacked on the board through an adhesive agent made of an insulating resin such that an adhesive agent layer is disposed between the sheet material and the board, wherein the sheet material is a single layer of an insulating resin and the sheet material includes a bottom surface directly contacting the adhesive agent layer and an end surface at one end of the sheet material, the adhesive agent includes a leaked portion leaked from the adhesive agent layer in an outward direction relative to the end surface to protrude upward to directly cover part of the end surface, and continuously extend from a lateral end of the adhesive agent layer in lateral direction along a top surface of the board, the leaked portion adhering to the part of the end surface of the sheet material to be continuous from a lower end of the end surface to form an inclined surface tapered in the outward direction such that the inclined surface makes a descending slope starting at a top of the leaked portion directly contacting the end surface and ending at the top surface of the board, the descending slope continuously descending from the top of the leaked portion directly contacting the end surface to the top surface of the board, the end surface is formed by a cut process such that the end surface has a greater surface roughness than the bottom surface, and the leaked portion adhering to the part of the end surface of the sheet material has an adhesion height, as measured from the bottom surface of the sheet material, of greater than 0% and not greater than 80% of a thickness of the sheet material, and wherein the board is a printed board body composed of a copper-clad laminate and a coverlay attached on the copper-clad laminate, and the sheet material is a reinforcing board to reinforce the printed board body.

2. A flexible printed circuit, comprising: a board composed of a base film having an insulating property and a circuit made of a conductor pattern formed on the base film; and a sheet material stacked on the board through an adhesive agent made of an insulating resin such that an adhesive agent layer is disposed between the sheet material and the board, wherein the sheet material is a single layer of an insulating resin and the sheet material includes a bottom surface directly contacting the adhesive agent layer and an end surface at one end of the sheet material, the adhesive agent includes a leaked portion leaked from the adhesive agent layer in an outward direction relative to the end surface to protrude upward to directly cover part of the end surface, and continuously extend from a lateral end of the adhesive agent layer in lateral direction along a top surface of the board, the leaked portion adhering to the part of the end surface of the sheet material to be continuous from a lower end of the end surface to form an inclined surface tapered in the outward direction such that the inclined surface makes a descending slope starting at a top of the leaked portion directly contacting the end surface and ending at the top surface of the board, the descending slope continuously descending from the top of the leaked portion directly contacting the end surface to the top surface of the board, the end surface is formed by a cut process such that the end surface has a greater surface roughness than the bottom surface, and the leaked portion adhering to the part of the end surface of the sheet material has an adhesion height, as measured from the bottom surface of the sheet material, of greater than 0% and not greater than 80% of a thickness of the sheet material, and wherein the board is a copper-clad laminate, and the sheet material is a coverlay to protect the copper-clad laminate.

* * * * *